United States Patent
Maheswaran (10) Patent No.: US 10,833,699 B1
(45) Date of Patent: Nov. 10, 2020

(54) RESISTOR BASED DELTA SIGMA MULTIPLYING DAC WITH INTEGRATED RECONSTRUCTION FILTER

(71) Applicant: Silicon Laboratories Inc., Austin, TX (US)

(72) Inventor: Dinesh Babu Mugunthu Maheswaran, Nashua, NH (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 16/548,417

(22) Filed: Aug. 22, 2019

(51) Int. Cl.
- H03M 3/00 (2006.01)
- H03H 7/01 (2006.01)
- H03M 1/66 (2006.01)
- H03M 1/00 (2006.01)

(52) U.S. Cl.
CPC ............ H03M 3/50 (2013.01); H03H 7/0161 (2013.01); H03M 1/00 (2013.01); H03M 1/66 (2013.01)

(58) Field of Classification Search
CPC ............. H03M 3/50; H03M 1/66; H03M 1/00
USPC ................................ 341/143, 144, 145, 150
See application file for complete search history.

(56) References Cited

U.S. PATENT DOCUMENTS

| | | | | |
|---|---|---|---|---|
| 7,277,035 B1* | 10/2007 | You | .................... | H03M 3/34 341/144 |
| 2009/0066552 A1* | 3/2009 | Quinn | .................. | H03M 1/0614 341/150 |
| 2010/0103013 A1* | 4/2010 | Deval | ..................... | H03M 3/33 341/143 |

* cited by examiner

*Primary Examiner* — Joseph J Lauture
(74) *Attorney, Agent, or Firm* — Zagorin Cave LLP (57) ABSTRACT

A digital to analog converter that includes a delta sigma modulator coupled to receive a digital data. The delta sigma modulator supplies a multi-bit resistor digital to analog converter (DAC). The multi-bit resistor digital to analog converter supplies an amplifier with an analog signal corresponding to the digital data. A first low pass filter is coupled between the multi-bit digital to analog converter and the amplifier stage and filters out shaped quantization noise before it reaches the amplifier. A second low pass filter is coupled to an output of the amplifier stage and filters out residual quantization noise and chopping artifacts from the amplifier stage.

20 Claims, 10 Drawing Sheets

RESISTOR BASED DELTA SIGMA MULTIPLYING DAC WITH INTEGRATED RECONSTRUCTION FILTER

BACKGROUND

Field of the Invention

The disclosure relates to digital to analog converters.

Description of the Related Art

Digital to analog converters are utilized in a wide variety of applications and function to convert a digital value to an analog value such as voltage or current. Accuracy in conversion helps ensure good system performance.

SUMMARY OF EMBODIMENTS OF THE INVENTION

In order to provide improved accuracy, in one embodiment, an apparatus includes a digital to analog converter that includes a multi-bit digital to analog converter (DAC) with unit elements and an amplifier stage coupled to the multi-bit DAC. A first low pass filter is coupled between the multi-bit DAC and the amplifier stage and a second low pass filter is coupled to an output of the amplifier stage and supplies an analog signal.

In another embodiment a method includes converting an input digital signal to a multi-bit digital to analog converter (DAC) to a first analog signal corresponding to the input digital signal. The first analog signal is filtered in a first low pass filter to remove high frequency components and then the first analog signal is supplied to an amplifier stage. The amplifier stage provides gain to the first analog signal and the amplifier stage supplies a second analog signal. The second analog signal is filtered in a second low pass filter, which supplies an output analog signal.

In another embodiment an apparatus includes an integrated circuit that has a phase-locked loop. The phase-locked loop includes a phase and frequency detector and a digital loop filter coupled to the phase and frequency detector and supplying a digital control signal. The integrated circuit further includes a digital to analog converter that includes a delta sigma modulator coupled to receive the digital control signal, a multi-bit digital to analog converter (DAC) coupled to receive an output of the delta sigma modulator, an amplifier stage coupled to the multi-bit digital to analog converter, a first low pass filter coupled between the multi-bit digital to analog converter and the amplifier stage, and a second low pass filter coupled to an output of the amplifier stage to supply an analog signal corresponding to the digital control signal. A voltage controlled crystal oscillator is coupled to the analog signal to supply a voltage controlled crystal oscillator output signal based on the analog signal.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
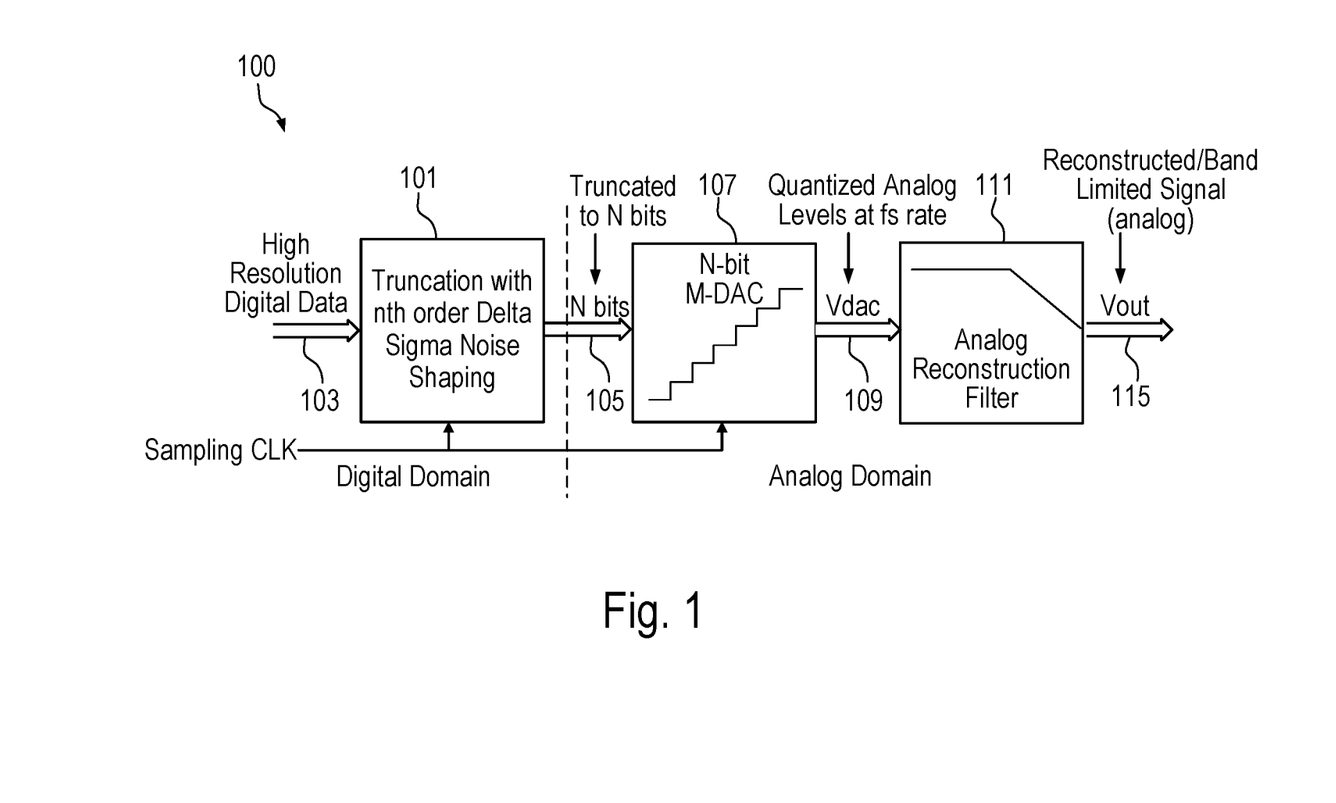
FIG. 1 illustrates a digital to analog converter that utilizes a delta sigma modulator based multiplying-DAC.

A digital to analog converter (DAC) described herein improves the quantization noise immunity by integrating the reconstruction filter within the resistor based delta sigma multiplying-DAC (MDAC). The DAC provides improved noise performance without sacrificing power and area. The primary function of a digital to analog converter (DAC) is to convert a digital code into an analog quantity such as voltage or current. FIG. 1 illustrates a digital to analog converter 100 that utilizes a delta sigma modulator based multiplying-DAC, which is a popular data converter topology because of the design benefit and flexibility the topology brings for low bandwidth applications. Designs can deploy a lower resolution DAC and still achieve a very high effective number of bits (ENOB) by employing a delta sigma modulation scheme. The DAC is paired with an analog reconstruction filter to produce the converted analog signal.

The delta sigma modulator 101 oversamples the high resolution input digital data 103 and up-converts the quantization noise in the signal band and pushes it to a higher frequency band that is outside the band of interest. Oversampling refers to the fact that the delta sigma modulator is clocked with a higher sampling rate (Fs) compared to the bandwidth of the signal being sampled. A low resolution DAC 107 can then be employed to convert this digital signal 105 supplied by the delta sigma modulator 101 from digital to analog. Low resolution DAC 107 supplies an analog signal Vdac 109. The DAC "reconstructs" the analog signal from digital. The re-construction filter 111 that follows removes the excess out of band noise and supplies Vout 115. In essence, the ENOB of the effective circuit is improved and is higher than the lower resolution DAC 107.

Figure 2:
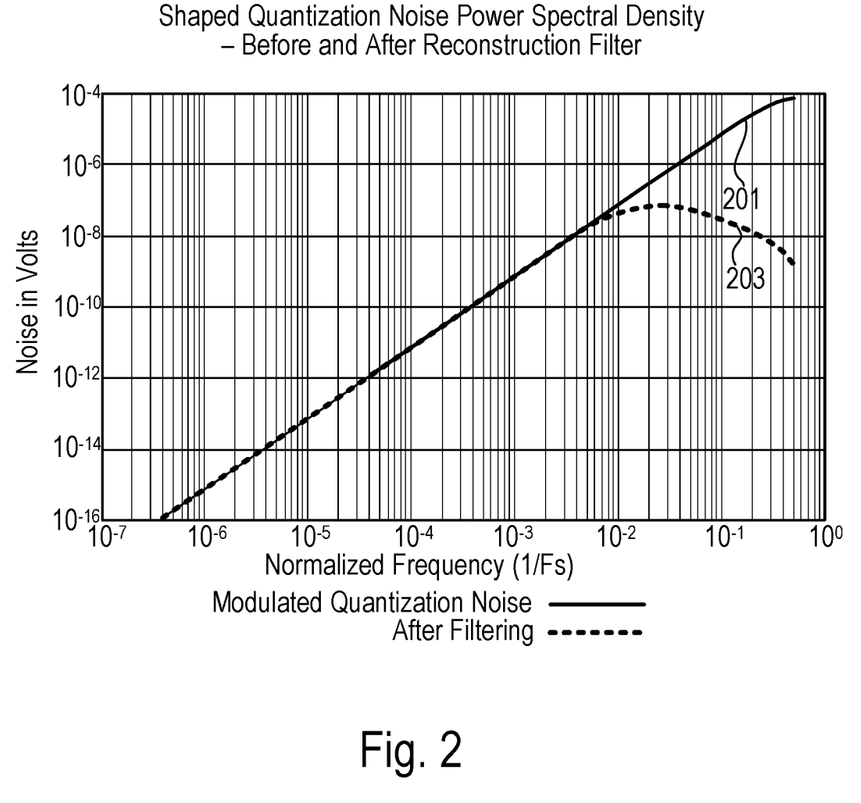
FIG. 2 illustrates the shaped quantization noise power spectral density (PSD) before and after the reconstruction filter.
Figure 3:
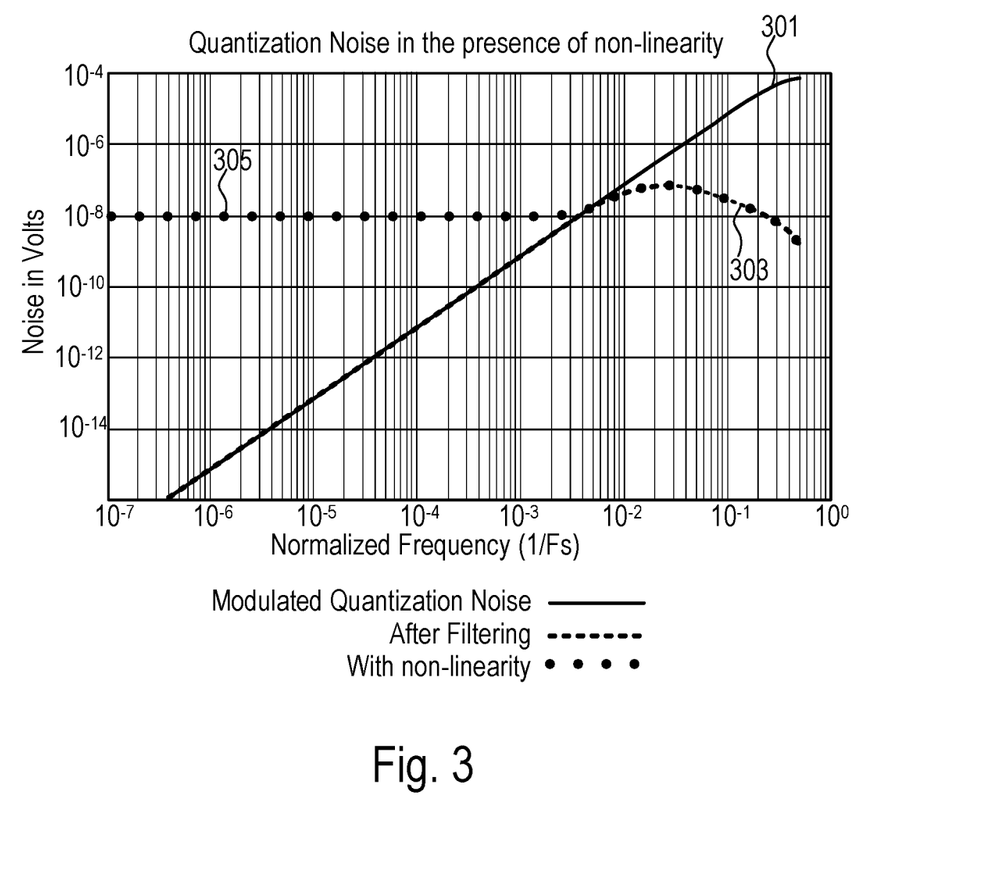
FIG. 3 illustrates the shaped quantization noise, the shaped quantization noise after filtering, and the quantization noise leaking into the signal band due to non-linearity in the analog circuits of the DAC.

FIG. 2 illustrates the shaped quantization noise power spectral density (PSD) before (201) and after (203) the reconstruction filter. The presence of large high frequency noise in turn requires good linearity performance from the DAC analog circuitry. Any non-linearity introduced in the analog circuitry can cause the quantization noise to leak back into the signal band. FIG. 3 illustrates how the low offset noise can be dominated by the quantization noise leaking into the signal band in the presence of non-ideal elements like non-linearity. FIG. 3 illustrates the shaped quantization noise 301, the shaped quantization noise after filtering 303, and the quantization noise leaking into the signal band at 305 due to non-linearity in the analog circuits of the DAC.

Figure 4:
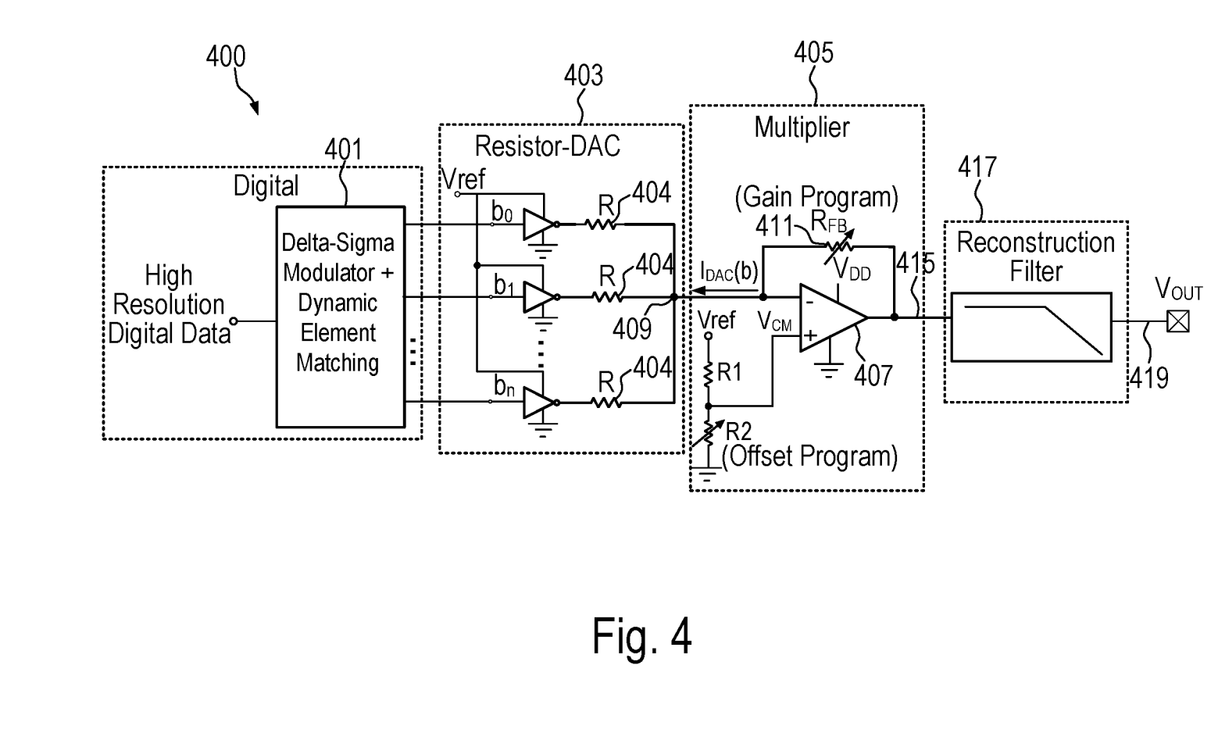
FIG. 4 illustrates a delta sigma modulator based multiplying DAC.

FIG. 4 illustrates a delta sigma modulator based multiplying DAC 400 that includes on the digital side a delta-sigma modulator 401. FIG. 4 illustrates a resistor DAC 403 on the analog side that is constructed using unit elements. The number of unit elements corresponds to the truncated number of levels from the delta sigma modulator. The unit elements can be constructed using blocks like a resistor, current source, etc., depending on the application. A resistor is a simple building block with practically no flicker noise. Flicker noise is a dominant low offset noise source, which is important for some applications. Thus, embodiments utilize resistors 404 as the DAC unit elements in the resistor DAC 403. A multi-bit resistor DAC, with multiple output levels, has many advantages over a single-bit DAC such as having a lower slew rate and being less sensitive to clock jitter.

However, one disadvantage of a multi-bit DAC is that it can suffer from non-linearity related issues due to the mismatch between unit elements due, e.g., to process variations during manufacture. That is the unit element resistors 404 (or other types of unit elements) may not precisely match each other. That non-linearity, if left untreated, can create issues as illustrated in FIG. 3. One approach to address mismatch is to use dynamic element matching (DEM) schemes like data weighted averaging. That in effect linearizes the DAC by rotating the unit element resistors with each code generated by the delta sigma modulator. Thus, in order to limit non-linearity in the unit elements DEM schemes are used in at least some of the embodiments described herein. In the embodiment shown in FIG. 4, the delta-sigma modulator 401 incorporates a dynamic element matching scheme to supply the code to the resistor DAC 403 to ensure that the unit elements corresponding to a particular code varies to limit the effects of non-linearity of the unit element resistors.

The delta sigma modulator based multiplying DAC 400 incorporates a multiplying amplifier stage 405 that receives the analog value generated by the resistor DAC 403 and includes an amplifier 407 that gives flexibility and supply variation tolerance to the design. The architecture could use a single reference voltage and still have a programmable full scale tailored to different external supply ranges. The architecture also allows hitting close to rail-to-rail output thereby improving the dynamic range. The amplifier 407 helps create a virtual ground at the output of DAC unit elements at node 409. The resistors in the resistor DAC element convert the reference voltage (Vref) into a reference current $I_{DAC}$ that corresponds to the incoming data code. The current carrying the data information is then flown through the feedback resistor ($R_{FB}$) 411 converting the current into voltage. The value of the adjustable feedback resistor controls gain and thus full scale is programmable through $R_{FB}$ 411. The amplifier stage 405 provides for offset control through adjustment of common mode resistor ratios by adjusting one or both of R1 and R2 (only R2 is adjustable in the illustrated embodiment). Being able to control full scale and offset brings flexibility to the design to operate under a wide variety of external supply ranges. The amplifier stage supplies the voltage signal 415 to the reconstruction filter 417. The reconstruction filter 417 following the amplifier then filters the high frequency quantization noise along with smoothing the output supplied as $V_{OUT}$ 419.

Figure 5:
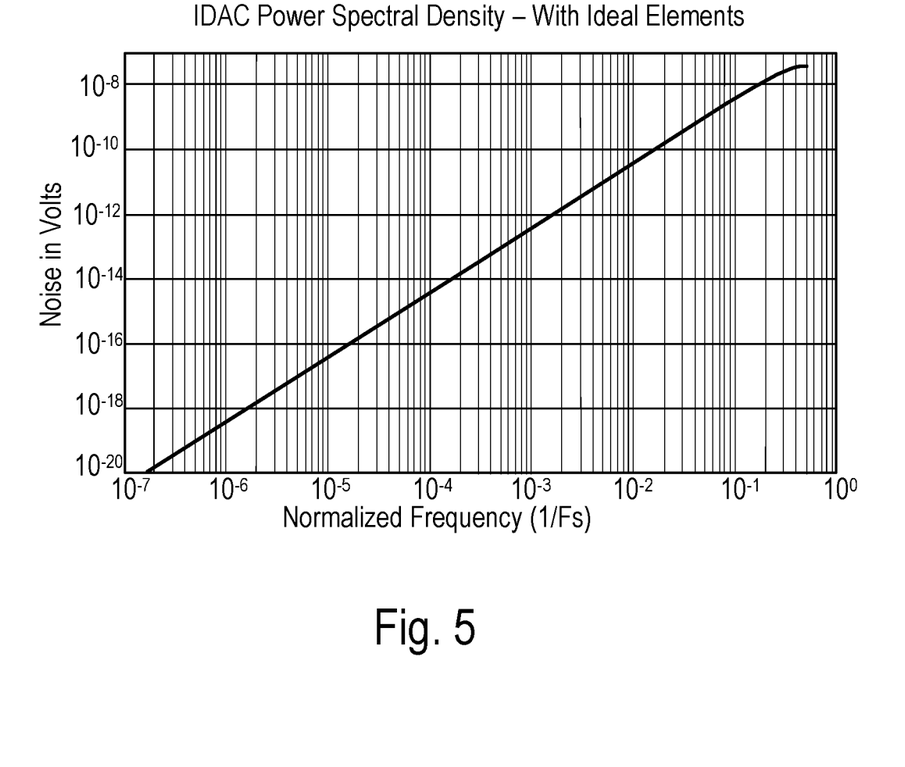
FIG. 5 illustrates the power spectral density of the $I_{DAC}$ signal supplied by the multi-bit resistor DAC.

FIG. 5 illustrates the power spectral density of the $I_{DAC}$ signal which is generated by a resistor based multiplying DAC described in FIG. 4 with ideal elements. This current is coupled to amplifier stage 405 (see FIG. 4). It can be seen that the spectrum has shaped quantization noise modulated to a higher frequency band. That results from the incoming modulated data having shaped quantization noise as well.

When low offset noise is also critical, chopping is frequently used to push out the flicker noise to outside of the signal band. The reconstruction filter which follows the amplifier stage 405 (FIG. 4) also filters out the up-converted flicker noise. In the topology illustrated in FIG. 4, chopping can be used in the amplifier to remove the device flicker noise sources. Chopping is a well known technique that modulates the 1/f noise and offset to a chopping frequency to reduce offset and 1/f noise. However, the chopping action also introduces non-linearity. Thus, the high frequency quantization noise could leak over into signal band thereby sacrificing in-band performance. Another impact of chopping is that the effective gain of the amplifier circuitry decreases due to the decreasing resistance created by the chopping switches with the parasitic capacitors.

Analyzing that mechanism further, with ideal circuit elements, it can be shown that the folding of this quantization noise occurs from even multiples of the chopping frequency. Since the delta sigma modulation creates noise several orders of magnitude higher at higher offset frequencies, this can create a major problem in applications that are noise sensitive. Even a relatively small non-linearity can result in several dB increase in the noise within the signal band.

Figure 6:
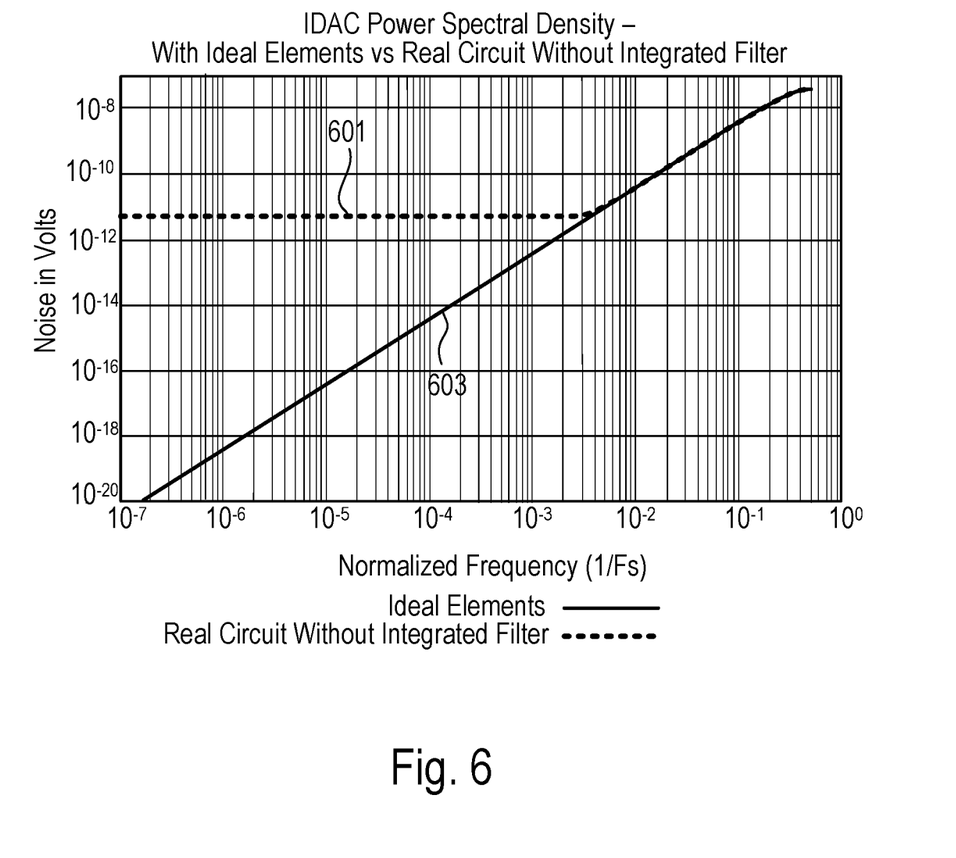
FIG. 6 illustrates the increased noise floor caused by leaked quantization noise into the signal band.

One way to get around this issue is by exploiting the fact that the PSD of the modulated signal has notches (zero or low noise) at even multiples of the sampling rate. Thus, chopping the circuit at half of sampling rate would be the ideal trade-off point. However, any non-idealities, like finite bandwidth or non ideal switches, in real circuits would still manifest as residual non-linearity. That non-linearity combined with the fact that the up-converted noise is several orders of magnitude higher can result in folding over the noise from all multiples of the sampling rate (including odd multiples where the noise is at maximum). The leaked quantization noise into the signal band manifests as an increased noise floor directly reducing the data converter resolution. FIG. 6 illustrates the increased noise floor at 601, which is well above the noise floor 603 with ideal elements.

Figure 7:
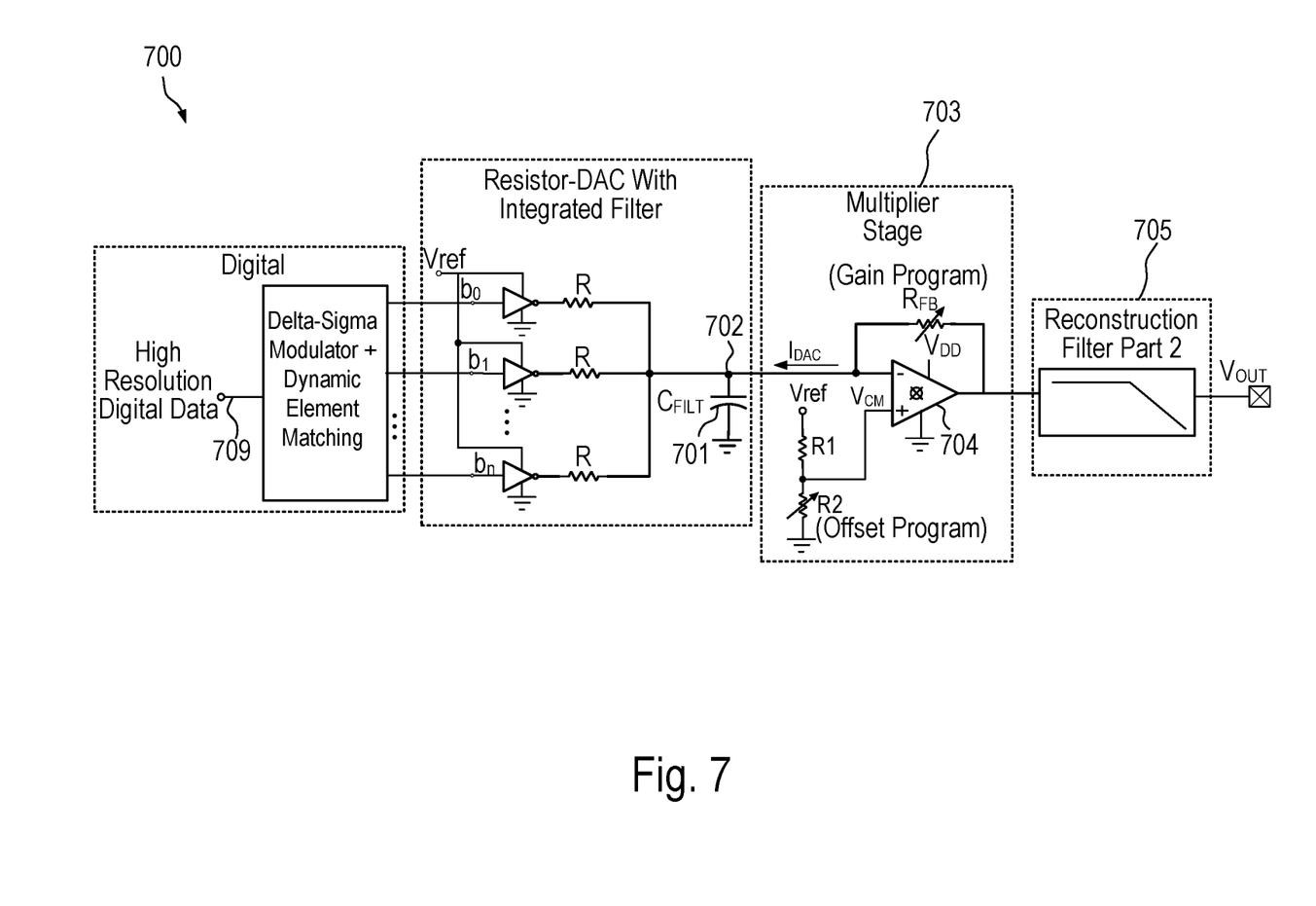
FIG. 7 illustrates a delta sigma modulator based multiplying DAC with a portion of the reconstruction filter integrated before the amplifier stage.

One approach that helps over-come this noise folding integrates a portion of the reconstruction filter with the multiplying-DAC as shown in delta-sigma modulator based multiplying DAC 700 in FIG. 7. That approach effectively reduces the quantization noise close to the source before it gets to the amplifier stage 703. The solution illustrated in the DAC 700 achieves reduced quantization noise before the noise gets to the amplifier circuitry by adding a filter including capacitor 701 at node 702 between the resistor DAC and the amplifier input. The impedance of node 702 goes down with frequency by nature of capacitor property. Thus, capacitor 701 provides a low impedance path to ground for the high frequency quantization noise and thus functions as a low pass filter. The signal of interest passes on to active circuitry in the amplifier stage 703 and thus to the output because the capacitor provides high impedance at low frequency (signal band). In effect, the reconstruction filter is split into two parts. The first part is the low pass filter provided by RC filter including capacitor 701. The second part of the reconstruction filter is provided by the portion 705 of the reconstruction filter after the chopping amplifier 704.

The architecture of the delta-sigma modulator based multiplying DAC 700 is significantly more immune to quantization noise as much of it gets filtered by the integrated filter formed by capacitor 701. That filter placement relaxes requirements on any active circuit which processes the filtered signal down the chain. As process nodes shrink, the analog circuits get more non-ideal. Thus, having the filter integrated between the resistor DAC and the amplifier stage provides a useful tool to deploy in more advanced and high performance applications.

Figure 8:
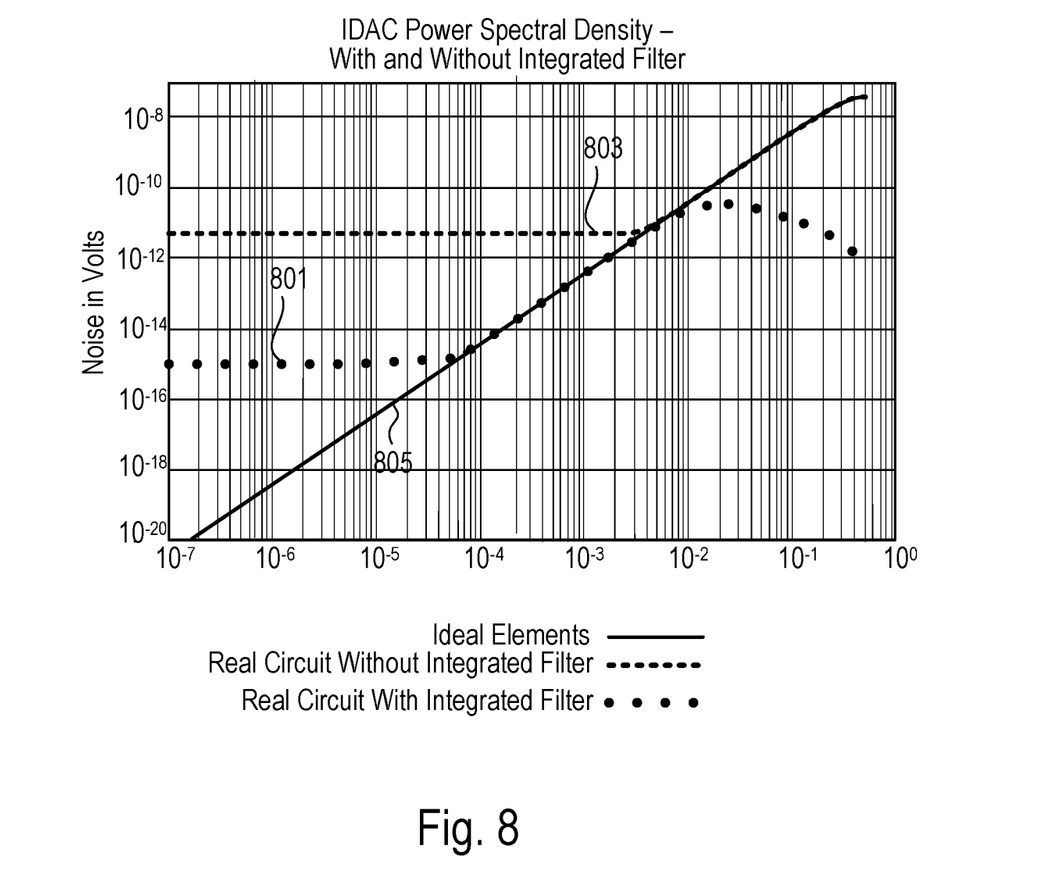
FIG. 8 illustrates the power spectral density with the integrated reconstruction filter, without the integrated filter, and with ideal elements.

FIG. 8 illustrates the PSD 801 of the DAC 700 with the integrated reconstruction filter along with the PSD of DAC 400 without the integrated filter. FIG. 8 shows the PSD 801 of a real circuit with the integrated filter forming the first part of the reconstruction filter in the resistor-DAC. FIG. 8 also shows the PSD 803 of a real circuit without the integrated filter. FIG. 8 also shows the PSD 805 of a circuit with ideal elements. As illustrated in FIG. 8, the high frequency noise in the signal band has been reduced dramatically (by several orders of magnitude) as shown by the difference between curve 801 and 803. Thus, the problem is tackled right at the source. There can be some residual noise leaking through to the signal band but that noise will be several orders of magnitude lower than without having the integrated filter before the amplifier. With the high frequency noise going to the active circuitry reduced considerably, the amplifier design can be simplified. That is because the integrated reconstruction filter increases the effective resolution of the signal to be multiplied by the amplifier. So even if the amplifier has non-idealities, the amount of noise the amplifier has to deal with is reduced to begin with. Thus, the non-linearity does not manifest into the same level of in-band noise increase. The second part of the re-construction filter 705 is then used to take out any remaining residual quantization noise as well as the up-converted flicker noise generated due to chopping. Other chopping artifacts (a tone at the chopping frequency and its harmonics) are also removed resulting in a clean and faithful re-production of the digital signal.

In an embodiment the resistor DAC RC filter 701 is implemented such that the corner of the filter is kept around signal bandwidth to filter out as much quantization noise as possible before going to the amplifier stage 704. In an embodiment the RC filter 701 forms a first order filter while the delta-sigma modulator is second order, the second part of the reconstruction filter 705 (after the amplifier) is a higher order filter to remove residual quantization noise. The second part of the reconstruction filter 705 also helps remove chopping artifacts from the chopping amplifier 704. Note that space availability is a practical consideration in deciding how to allocate the capacitance between the two portions.

Figure 9:
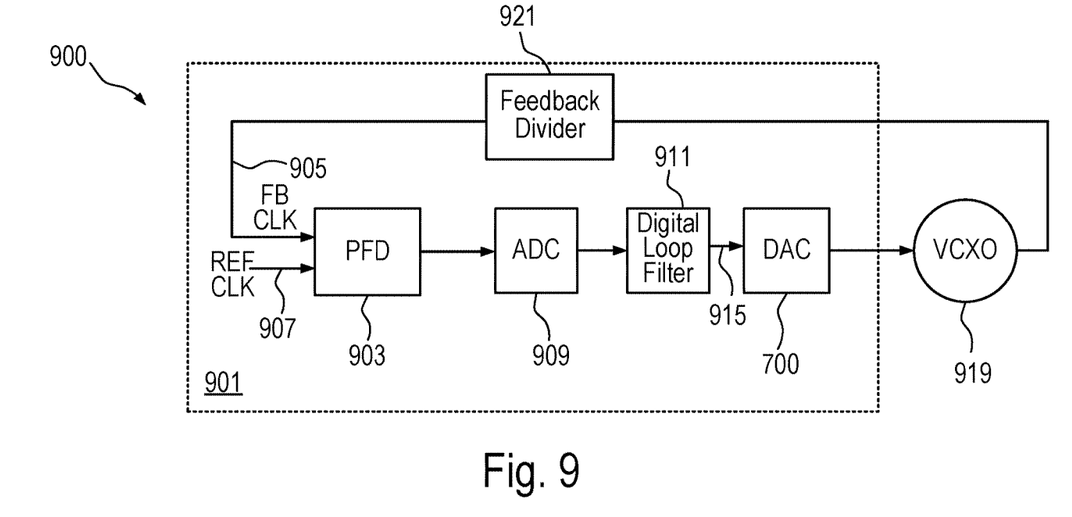
FIG. 9 illustrates a system that utilizes the analog output from the DAC to control a voltage controlled crystal oscillator.
Figure 10:
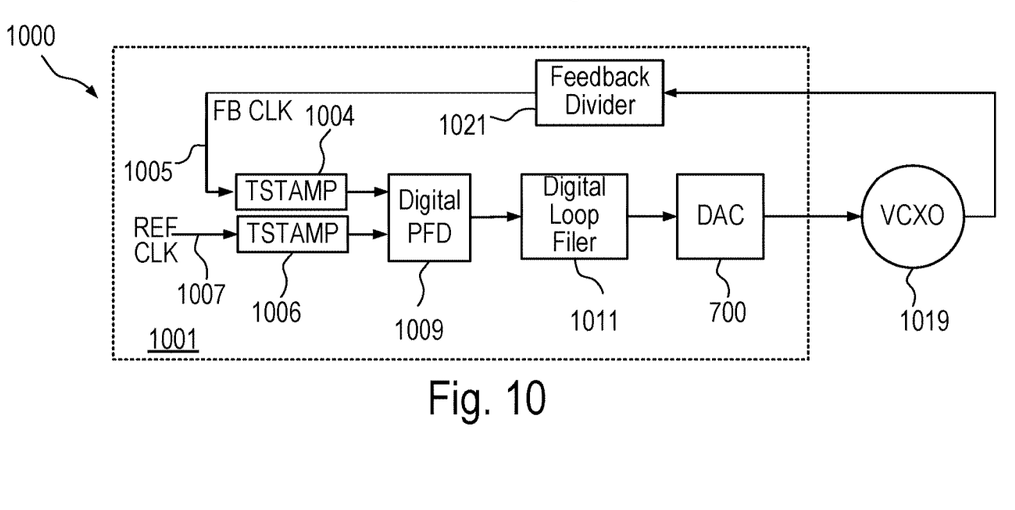
FIG. 10 illustrates another example of a system that utilizes the analog output from the DAC to control a voltage controlled crystal oscillator.
Figure 11:
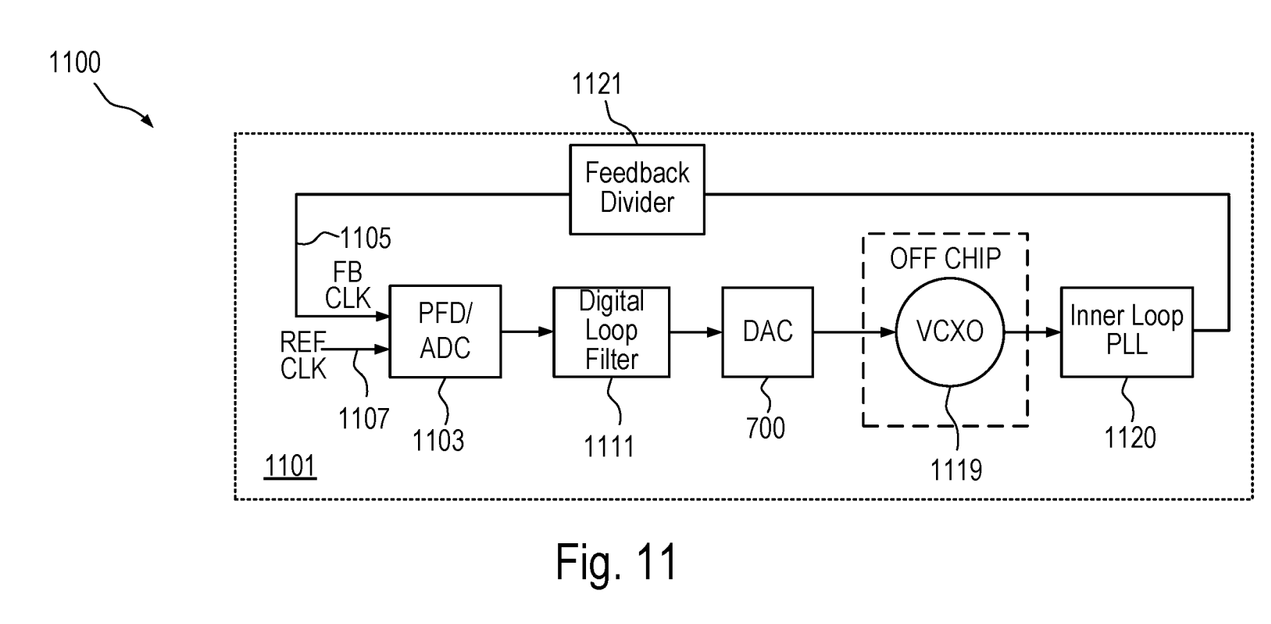
FIG. 11 illustrates another example of a system that utilizes the analog output from the DAC to control a voltage controlled crystal oscillator.

The digital to analog converter 700 can be used in a wide variety of applications to faithfully convert a digital signal to an analog voltage value. FIGS. 9-11 illustrate various examples where the DAC 700 can be utilized. FIG. 9 illustrates a high level block diagram of a PLL system 900 that includes an integrated circuit 901. In the embodiment of FIG. 9, a phase and frequency detector 903 receives a feedback clock 905 and a reference clock 907. The reference clock may come from a source external to integrated circuit 901. An analog to digital converter (ADC) 909 converts the output of the PFD to a digital value and supplies the digital value to a digital loop filter 911, which generates a digital value 915 that is supplied to the DAC 700 (illustrated in FIG. 7). Digital value 915 corresponds to the DAC input 709 shown in FIG. 7. DAC 700 supplies an analog control signal to control a voltage control crystal oscillator (VCXO) 919 that is separate (at least the crystal) from integrated circuit 901. The output of the VCXO 919 is supplied to feedback divider 921, which in turn supplies the feedback clock signal 905. While FIG. 9 shows an external VCXO being controlled by the analog signal, other embodiments utilize a different external oscillator controlled by the DAC output.

FIG. 10 illustrates a high level diagram of another PLL system 1000 that includes an integrated circuit 1001. In the embodiment of FIG. 10, time stamp logic 1004 receives a feedback clock signal 1005 and time stamp logic 1006 receives a reference clock signal 1007. The reference clock may come from a source external to integrated circuit 1001. The time stamp logic 1004 and time stamp logic 1006 and convert the clock signals 1005 and 1007 to digital values for digital processing by the digital PFD 1009. The digital PFD supplies a digital value to the digital loop filter 1011, which in turn supplies DAC 700 with an input digital signal to be converted to an analog value. DAC 700 supplies an analog control signal to control a voltage control crystal oscillator (VCXO) 1019 that is separate (at least the crystal) from integrated circuit 1001. The output of the VCXO 1019 is supplied to feedback divider 1021, which in turn supplies the feedback clock signal 1005. While FIG. 10 shows an external VCXO being controlled by the analog signal, other embodiments utilize a different external oscillator controlled by the DAC output.

FIG. 11 illustrates a high level diagram of another PLL system 1100 that includes an integrated circuit 1101 and multiple PLLs that are locked. In the embodiment of FIG. 11, PFD/ADC 1103 receives the feedback clock signal 1105 and the reference clock signal 1107 and supplies a digital value to digital loop filter 1109. The digital loop filter 1111 supplies DAC 700 with an input digital signal to be converted to an analog value. DAC 700 supplies an analog control signal to control a voltage control crystal oscillator (VCXO) 1119 that is separate (at least the crystal) from integrated circuit 1101. The output of the VCXO 1119 is supplied as a reference input clock signal to an inner loop PLL 1120, which in turn supplies the feedback divider 1121. Feedback divider 1121 supplies the feedback clock signal 1105. While FIG. 11 shows an external VCXO being controlled by the analog signal, other embodiments utilize a different external oscillator controlled by the DAC output.

Thus, an improved digital to analog converter has been described that incorporates a filter into the resistor-DAC between the resistor-DAC and the amplifier stage and includes a filter after the amplifier stage. Other variations and modifications of the embodiments disclosed herein, may be made based on the description set forth herein, without departing from the scope of the invention as set forth in the following claims.

What is claimed is:
1. An apparatus comprising:
   a phase-locked loop including a digital loop filter to supply a digital control signal;
   a digital to analog converter including,
      a delta sigma modulator coupled to receive the digital control signal from the digital loop filter and supply digital data after processing the digital control signal;

a multi-bit digital to analog converter (DAC) with unit elements coupled to receive the digital data from the delta sigma modulator;
an amplifier stage coupled to the multi-bit DAC;
a first low pass filter coupled between the multi-bit DAC and the amplifier stage; and
a second low pass filter coupled to an output of the amplifier stage and coupled to supply an analog signal.

2. The apparatus as recited in claim 1 wherein the first low pass filter is a first order filter.

3. The apparatus as recited in claim 2 wherein the second low pass filter is a higher order filter.

4. The apparatus as recited in claim 1 wherein the amplifier stage includes a chopped amplifier.

5. The apparatus as recited in claim 1 further comprising:
a voltage controlled crystal oscillator (VCXO) coupled to the analog signal and configured to supply a VCXO output signal according to the analog signal.

6. The apparatus as recited in claim 5 further comprising:
a phase and frequency detector coupled to receive the VCXO output signal.

7. The apparatus as recited in claim 1, wherein the multi-bit DAC uses resistors as the unit elements.

8. The apparatus as recited in claim 7 wherein the resistors supply a current to the amplifier stage indicative of the digital data from the delta sigma modulator.

9. The apparatus as recited in claim 1 further comprising:
a first resistor and a second resistor coupled in series between a power supply node and ground, a node between the first and second resistors coupled to an amplifier of the amplifier stage;
wherein at least one of the first and second resistors is variable to allow adjustment of a common mode resistor ratio to thereby provide offset control; and
a variable feedback resistor in the amplifier stage coupled between an output of the amplifier stage and a second input to the amplifier stage, a value of the variable feedback resistor controlling gain of the amplifier stage.

10. A method comprising:
generating a digital loop filter output signal in a digital loop filter of a phase-locked loop;
supplying the digital loop filter output signal to a delta sigma modulator;
generating a delta sigma modulator output signal based on the digital loop filter output signal;
supplying the delta sigma modulator output signal to a multi-bit digital to analog converter (DAC);
converting the delta sigma modulator output signal supplied to the multi-bit DAC to a first analog signal;
filtering the first analog signal to remove high frequency components from the first analog signal in a first low pass filter and generating a filtered first analog signal and supplying the filtered first analog signal to an amplifier stage;
providing gain to the filtered first analog signal in an amplifier stage and supplying a second analog signal from the amplifier stage; and
filtering the second analog signal from the amplifier stage in a second low pass filter and supplying from the second low pass filter an output analog signal.

11. The method as recited in claim 10 further comprising using chopping in the amplifier stage to reduce device flicker noise.

12. The method as recited in claim 10 wherein the first low pass filter is a first order filter.

13. The method as recited in claim 12 wherein the second low pass filter is a higher order filter.

14. The method as recited in claim 10 further comprising:
supplying the output analog signal to a voltage controlled crystal oscillator (VCXO) and generating a VCXO output signal according to the output analog signal.

15. The method as recited in claim 14 further comprising:
supplying a feedback divider with the VCXO output signal.

16. An apparatus comprising:
an integrated circuit including,
a phase-locked loop including,
a phase and frequency detector;
a digital loop filter coupled to the phase and frequency detector and supplying a digital control signal;
a digital to analog converter including,
a delta sigma modulator coupled to receive the digital control signal;
a multi-bit digital to analog converter (DAC) coupled to receive an output of the delta sigma modulator;
an amplifier stage coupled to the multi-bit digital to analog converter;
a first low pass filter coupled between the multi-bit digital to analog converter and the amplifier stage; and
a second low pass filter coupled to an output of the amplifier stage to supply an analog signal corresponding to the digital control signal; and
a voltage controlled crystal oscillator coupled to the analog signal to supply a voltage controlled crystal oscillator output signal based on the analog signal.

17. The apparatus as recited in claim 16 wherein the multi-bit DAC comprises resistors as unit elements.

18. The apparatus as recited in claim 17 wherein the resistors supply a current to the amplifier stage indicative of the output of the delta sigma modulator.

19. The apparatus as recited in claim 16 further comprising a feedback divider of the phase-locked loop coupled to an output of the voltage controlled crystal oscillator.

20. The apparatus as recited in claim 16 further comprising:
a first resistor and a second resistor coupled in series between a power supply node and a ground node, a node between the first and second resistors coupled to an input of an amplifier of the amplifier stage;
wherein at least one of the first and second resistors is variable to allow adjustment of a common mode resistor ratio to thereby provide offset control for the amplifier stage; and
a variable feedback resistor in the amplifier stage coupled to a second input of the amplifier, a value of the variable feedback resistor controlling gain of the amplifier stage.

* * * * *